United States Patent [19]

Fang et al.

[11] Patent Number: 4,713,329

[45] Date of Patent: Dec. 15, 1987

[54] WELL MASK FOR CMOS PROCESS

[75] Inventors: Robert Fang, Cupertino; Jerry Wang, Los Altos Hills; Victor Liang, Capistrano Beach; Joseph Farb, Riverside; Chung Hsu, Cupertino, all of Calif.

[73] Assignee: Data General Corporation, Sunnyvale, Calif.

[21] Appl. No.: 757,331

[22] Filed: Jul. 22, 1985

[51] Int. Cl.$^4$ .................. H01L 7/54; H01L 21/265
[52] U.S. Cl. .......................... 437/29; 437/20; 437/27; 437/28; 437/30; 437/34; 437/56; 437/933; 357/42; 357/90
[58] Field of Search ............. 29/571, 578, 576 B; 148/1.5, DIG. 3, DIG. 83, DIG. 84; 156/662, 644; 357/42

[56] References Cited

U.S. PATENT DOCUMENTS

| | | | |
|---|---|---|---|
| 3,876,472 | 4/1975 | Polinsky | 148/1.5 |
| 3,983,620 | 10/1976 | Spadea | 29/571 |
| 4,013,484 | 3/1977 | Boleky et al. | 148/1.5 |
| 4,043,025 | 8/1977 | Spadea | 29/571 |
| 4,045,259 | 8/1977 | Sanders | 148/188 |
| 4,047,284 | 9/1977 | Spadea | 29/571 |
| 4,131,907 | 12/1978 | Ouyang | 357/42 |
| 4,135,955 | 1/1979 | Gasner et al. | 148/187 |
| 4,143,388 | 3/1979 | Esaki et al. | 357/23 |
| 4,152,717 | 5/1979 | Satou et al. | 357/42 |
| 4,183,134 | 1/1980 | Oehler et al. | 29/571 |
| 4,282,648 | 8/1981 | Yu et al. | 29/571 |
| 4,295,266 | 10/1981 | Hsu | 29/571 |
| 4,306,916 | 12/1981 | Wollesen et al. | 148/1.5 |
| 4,314,857 | 2/1982 | Aitken | 148/1.5 |
| 4,335,504 | 6/1982 | Lee | 29/576 B |
| 4,372,033 | 2/1983 | Chiao | 29/571 |
| 4,373,253 | 2/1983 | Khadder et al. | 29/576 B |
| 4,376,336 | 3/1983 | Endo et al. | 29/571 |
| 4,382,827 | 5/1983 | Romano-Moran et al. | 148/1.5 |
| 4,385,947 | 5/1983 | Halfacre et al. | 148/187 |
| 4,391,650 | 7/1983 | Pfeifer et al. | 148/1.5 |
| 4,409,726 | 10/1983 | Shiota | 29/571 |
| 4,412,375 | 11/1983 | Matthews | 29/571 |
| 4,420,872 | 12/1983 | Solo de Zaldivar | 29/571 |
| 4,517,731 | 5/1985 | Khan et al. | 29/571 |
| 4,567,640 | 2/1986 | Fang et al. | 29/571 |

*Primary Examiner*—Brian E. Hearn
*Assistant Examiner*—Chi Tso Huang
*Attorney, Agent, or Firm*—Malcolm B. Wittenberg

[57] ABSTRACT

A method of forming CMOS transistors with self-aligned field regions. First and second spaced apart areas are provided on a silicon substrate. A masking member is formed protecting the first of said areas and exposing the second. The exposed area is doped with a p-type material which is driven in to form a p-well. The same region is again doped with additional p-type material after which the CMOS transistors are fabricated.

15 Claims, 7 Drawing Figures

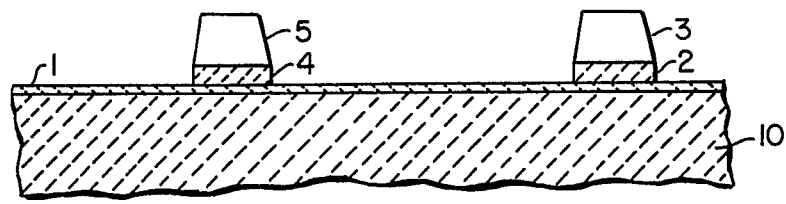
FIG._1.
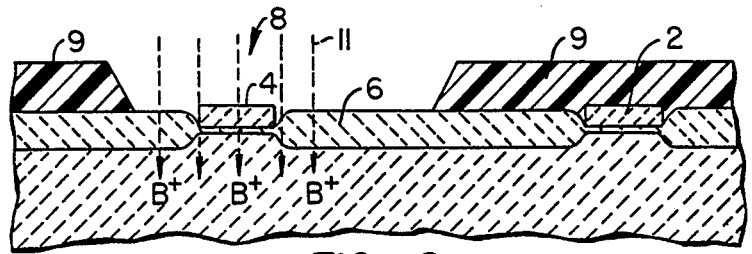
FIG._2.
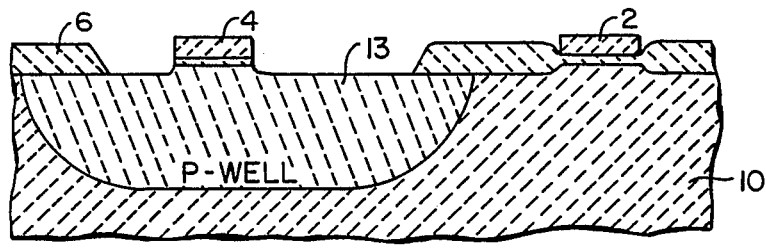
FIG._3.
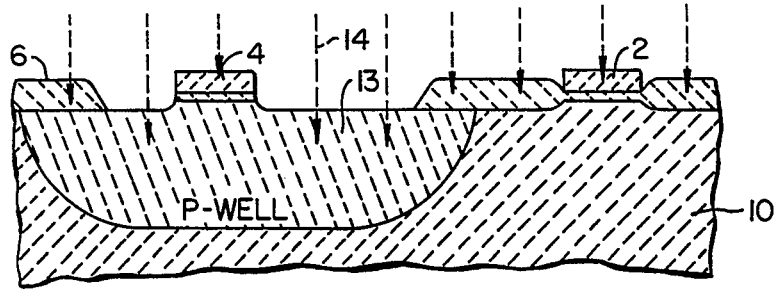
FIG._4.
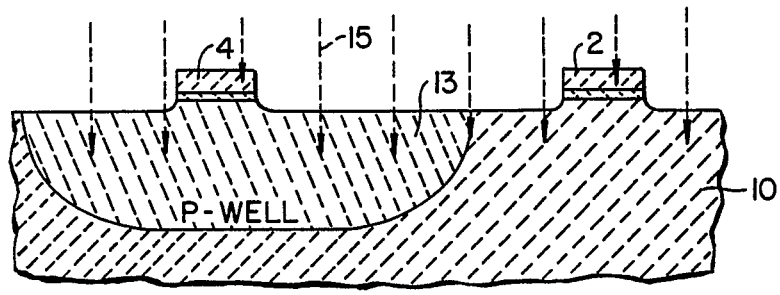
FIG._5.

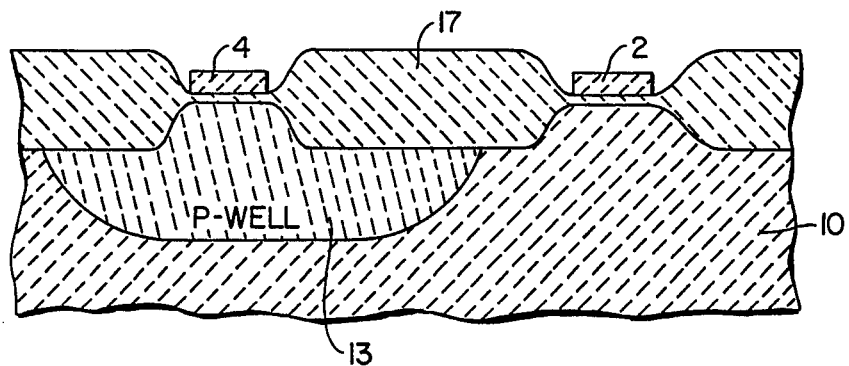
FIG._6.
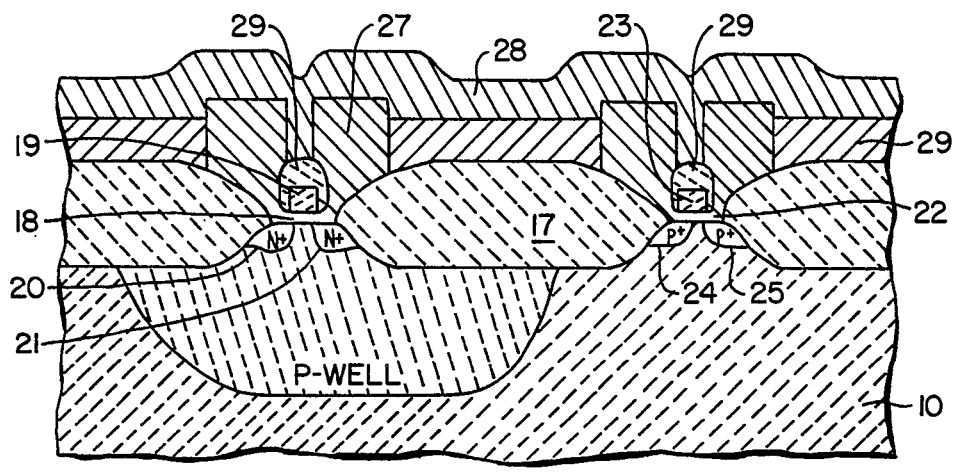
FIG._7.

4,713,329

WELL MASK FOR CMOS PROCESS

DESCRIPTION

TECHNICAL FIELD OF INVENTION

A new method of fabricating CMOS transistors with field implantation after well drive-in is disclosed. The self-aligned field regions are achieved without using any additional masking steps other than the mask required to form the well-known p-well region. As such, adequate field threshold voltages can be obtained without using the complex double field masks for n-channel stop and p-channel stop regions.

BACKGROUND OF THE INVENTION

CMOS field-effect transistors exhibit the characteristics of high switching speeds and high noise immunity over a wide range of power supply voltages. As such, they are commonly used in such devices as wrist watches, hand-held calculators and in other environments where low power consumption is desirable.

In the prior art, the most typical way to introduce a well of opposite seminconductor type is to introduce the well as the first step in a CMOS fabrication process prior to constructing the balance of the circuit. This is accomplished by using a mask to selectively introduce dopants into areas where wells are desired and then driving the dopants to make a well.

Because the construction of P and N channel transistors differs in a variety of ways, multiple masks must be used which are practically identical to the well mask, to selectively introduce wells into regions of the wafer where needed.

In the prior art, high voltage CMOS devices have used field oxides and heavily doped substrates and wells to reduce leakage between neighboring active MOS areas. In particular, if a reasonably high field threshold is desired, at least one, and more often two, masks are required to accomplish this field threshold adjustment. These masks are identical to the well mask pattern, except perhaps for their size. But such devices generally exhibit unsatisfactory AC performance, as such devices exhibit high threshold voltages and high capacitance.

To reduce leakage problems without employing thick field oxides and heavily doped substrates, various full channel stops spaced apart from the active devices which they surround have been proposed. Techniques, such as ion implantation, are employed requiring rather complex processing conditions involving a number of masking steps in addition to those required in the formation of the active devices. As such, the channel stops are not self-aligning with the active elements.

U.S. Pat. No. 4,013,484 discloses and claims a method of forming channel stops while reducing the number of additional masking steps previously required. In doing so, the referenced patent teaches the creation of channel stops of opposite conductivity type in a silicon substrate between first and second spaced apart active regions. In practicing that invention, certain deficiencies persist.

For example, in providing a p-well and corresponding channel stops of sufficient width to provide the necessary isolation, the p-type material is driven deeply into the silicon substrate diminishing the utility of the invention in high density applications. As with the prior art, the process disclosed in U.S. Pat. No. 4,013,484 teaches a method for producing channel stop regions which are not self-aligned to the p-well boundary. Further, because of the depth to which the channel stops must be driven to fully isolate the active regions, reduction in source-drain junction breakdown voltage is experienced as well as a corresponding increase in source-drain side wall capacitance.

It is thus an object of the present invention to provide a method for fabricating CMOS transistors without experiencing the difficulties outlined above.

It is yet another object of the present invention to provide a method for fabricating CMOS transistors with self-aligned field regions without employing additional masking steps other than the single masking step used to define the p-well region.

It is yet another object of the present invention to provide a method of fabricating CMOS transistors allowing a minimum space to be used to separate the n-channel and p-channel transistors.

These and other objects will be more readily appreciated when considering the following disclosure and appended drawings in which:

FIGS. 1–7 sequentially depict the processing steps employed in carrying out the method of the present invention.

SUMMARY OF THE INVENTION

The objects recited above are substantially achieved by engaging the following method in providing on a silicon substrate first and second spaced apart areas for CMOS transistors. On said substrate is formed a masking member to protect the first of said areas while exposing the second. The second area is doped with a p-type material which is then driven into the silicon body to form the well-known p-well. Isolation is enhanced by further doping the second area with additional p-type material which then can be, optionally, followed with a uniform doping of a material of opposite conductivity type.

DETAILED DESCRIPTION OF THE INVENTION

As noted above, a novel process for fabricating high density, complementary metal-oxide-semiconductor (CMOS) devices is disclosed. These devices are capable of carrying relatively high voltages, while the various self-aligned field regions are fabricated without using any additional masking steps other than the mask forming the well-known p-well region. The specific process is disclosed by reference to FIGS. 1–7. By practicing this method, it is possible to fabricate n-channel and p-channel transistors in the same chip or circuit for achieving significant advantages in power consumption as compared to NMOS or bi-polar devices while increasing the chip density above that heretofore achievable without the use of additional masking steps.

Turning first to FIG. 1, an n-type silicon substrate typically having a resistivity of 0.9 to 1.2 ohm-cm shown as element 10 over which rests a thin layer of silicon dioxide ($SiO_2$), which can be grown in dry or steam conditions typically to a thickness or approximately 300–500 Å. By employing the above-referenced resistivity of the silicon substrate, a short p-channel transistor with masked channel length of approximately 3 microns can be made without additional channel implantation. However, other n-type silicon bodies can be employed with various resistivities in practicing the present invention.

After the growth of $SiO_2$ layer 1, silicon nitride or other oxide blocking film is deposited preferably within the thickness range of approximately 1,000–1,500 Å, to which is applied photoresist which is patterned using standard photolithographic techniques widely known in the art. Upon selective removal of the unpolymerized photoresist, the nitride and protective photoresist remain at areas 2 and 3 and 4 and 5 of FIG. 1, hereinafter referred to as "first" and "second" regions, which will be sites for later configured transistors.

Turning now to FIG. 2, resists 3 and 5 have been removed and field oxide 6 grown to a thickness approximately greater than or equal to 2,000 Å. As will be discussed later in more detail, this oxide serves as a mask against subsequent field implantation. It should also be noted that the field oxide typically does not grow over nitride and, as such, its cross-sectional profile is typified by that shown in FIG. 2.

Applied over field oxide 6 is well mask 9 composed of photoresist. The well mask is removed selectively in an area surrounding second active region 4 to expose region 8. This opened area 8 is used for the ion implantation of p-type material, such as boron 11. These ions are used to form the p-well region and are generally applied to the surface of silicon body 10 in doses of approximately $3 \times 10^{12}$ to $1 \times 10^{13}$ ions/cm$^2$, resulting in a p-well bulk concentration after drive-in of approximately $5 \times 10^{15}$ to $2 \times 10^{16}$ ions/cm$^3$. Different doses may alternatively be used for particular applications, depending on thresholds, component densities and other constraints typically considered in design/process applications. When the p-type impurity 11 was implanted within region 8, it was done at an energy level high enough so that the impurity penetrated nitride layer 4 and exposed field oxide 6, but not well mask 9. It should further be noted in reference to FIG. 3 that well mask layer 9 can be removed after the etching of field oxide layer 6 selectively in exposed region 8. As such, the remaining field oxide acts as an oxide mask for silicon body 10 during further implantation cycles to be described more fully hereinafter. Thus, all of the p-type impurity is in an area surrounding nitride layer 4, and is then subjected to a drive-in cycle to diffuse the implant, such as boron, to define p-well region 13, which, for purposes of illustration, is formed to a depth of between approximately 2 to 7 μm.

The p-well drive-in generally is performed at temperatures between approximately 1100°–1200° C. After drive-in, further implantation (i.e., the field implant) of any p-type impurity, such as boron or BF$_2^+$ ions 14 (FIG. 4) is carried out at energy levels low enough to allow implantation at p-well 13, but not in regions covered by either oxide 6 or nitride 4 and 2, shown in FIG. 4. Preferably, these later applied dopants are employed in the typical density range of approximately $2 \times 10^{12}$ to $2 \times 10^{14}$ ions per square centimeter.

By following the above-recited sequence, field implantation is achieved with no additional mask other than the well mask required to form the concentration channel stops, i.e., densities of approximately $5 \times 10^{16}$ ions per cubic centimeter. However, concentrations with a range of $1 \times 10^{15}$ to $5 \times 10^{17}$ ions/cm$^3$ have also been found to be suitable. As such, the p-well can be doped to increase its field threshold voltage with no additional masking steps other than the single masking step used to form the p-well region itself.

As an optional embodiment, reference is made to FIG. 5 wherein an opposite impurity type 15, such as phosphorus or arsenic ions, is uniformly applied to the surface of the silicon substrate 10 at energy levels which are high enough to achieve implantation but low enough so that penetration cannot be carried out through nitride layers 2 and 4. In order to uniformly dope the surface of the wafer with Phosphorous or Arsenic the remainder of the field oxide must first be removed. Thus, ions 15 are implanted within p-well region 13 and n-type region 16 to enhance the p-field threshold voltage even further.

Referring now to FIG. 6, second field oxide layer 17 is grown to a thickness of approximately 0.5 to 1.5 μm by, for example, the conventional steam oxidation process. As noted, the oxide does not grow above nitride layers 2 and 4, which are the sites of the latter formed active elements. In progressing to FIG. 7, nitride layers 2 and 4 are removed prior to formation of the active devices.

The active devices are fabricated by reference to FIG. 7. A gate oxide 18 and polycrystalline silicon gate electrode 19 are shown disposed above and between source and drain regions 20 and 21 of the n-channel device p-well 13. The source and drain regions are formed in self-alignment with gate 19 and field oxide 17.

Further, gate oxide 22 and polysilicon gate electrode 23 for the p-channel device are shown disposed with the source and drain regions 24 and 25 which are, in turn, formed in self-alignment with field oxide 17. Leads 27 can then be applied which are isolated by oxide layer 29 and the structure completed by passivation layer 28.

In an attempt to highlight the process of the present invention, it is particularly noted that the ion implantation 14 carried out in conjunction with reference to FIG. 4 is applied uniformly over the surface of the silicon substrate and is thus implanted into the p-well region without additional masks. This implantation significantly reduces or eliminates weak field regions which appear laterally in prior art p-well structures. It further substantially reduces weak field inversion regions and thus stray leakage channels from polysilicon or metal electrodes placed atop the areas. As a further consequence, both the n-channel and p-channel field regions are made without using extra masks other than the standard p-well masks shown in FIG. 2.

From the above discussion, a number of details of the presently preferred process, such as specific conductivity type, specific impurity, and impurity concentrations have been included to provide a complete disclosure of the present invention. However, as will be appreciated, variations of the described process may be employed, these variations being obvious to one skilled in the art. In some instances, detailed descriptions of well-known photolithographic steps have not been included in order not to obscure the inventive process in detail.

We claim:

1. A method of forming complementary metal oxide semiconductor transistors with field regions fabricated without using additional field masks comprising, in the sequence provided, the steps of:

A. providing on a first conductivity type silicon substrate first and second spaced apart areas for said complementary metal oxide semiconductor transistors;

B. forming a masking member on said substrate protecting the first of said areas and exposing the second;

C. doping the second area with second conductivity type modifiers;

D. driving in said second conductivity type modifiers to form a well region;

E. further doping the second area with additional well dopant of said second conductivity type modifiers without increasing the size of said second area exposed by said masking member; and F. fabricating complementary metal oxide semiconductor transistors in said first and second spaced apart areas.

2. The method of claim 1 wherein said first and second spaced apart areas are in part covered by silicon nitride prior to forming said masking member.

3. The method of claim 2 wherein a field oxide is formed on the silicon substrate after applying said silicon nitride.

4. The method of claim 1 further comprising the step of substantially uniformly doping the silicon substrate with n-type material prior to fabricating said CMOS transistors.

5. A method of forming complementary metal oxide semiconductor transistors with field regions fabricated without using additional masking steps comprising, in the sequence provided, the steps of:

A. providing on a first conductivity type silicon substrate first and second spaced apart areas;

B. selectively applying silicon nitride to said first and second areas;

C. applying a field oxide over portions of said silicon substrate;

D. providing a well mask to substantially cover the first of said areas but not the second of said areas;

E. doping the exposed second area with second conductivity type modifiers;

F. etching portions of said field oxide in said second area;

G. forming a well region by driving in said second conductivity type modifiers;

H. uniformly applying additional said second conductivity type modifiers to the substrate which passes into the substrate in said well region but not in regions covered with field oxide and silicon nitride; and I. fabricating complementary metal oxide semiconductor transistors in said first and second spaced apart areas.

6. The method of claim 5 further comprising the steps of:

A. removing the field oxide after uniform application of the additional said second conductivity type modifiers to the substrate followed by:

B. uniformly applying first conductivity type modifiers to the surface of the substrate.

7. The method of claim 1 wherein said well region is formed to a depth of at least 2 $\mu$m.

8. The method of claim 1 wherein said well region is formed to a depth of approximately 2 $\mu$m to 20 $\mu$m.

9. The method of claim 1 wherein said substrate has a resistivity in the range of 0.9–1.2 ohm-cm.

10. The method of claim 5 wherein said substrate has a resistivity in the range of 0.9–1.2 ohm-cm.

11. A method of forming complementary metal oxide semiconductor transistors with field regions fabricated without using additional masking steps comprising, in the sequence provided, the steps of:

A. providing on an n-type silicon substrate first and second spaced apart areas;

B. selectively applying silicon nitride to said first and second areas;

C. applying a field oxide over portions of said silicon substrate;

D. providing a well mask to substantially cover the first of said areas but not the second of said areas;

E. doping the exposed second area with a p-type material;

F. etching portions of said field oxide in said second area;

G. forming a the p-well region by driving in said second conductivity type modifiers;

H. uniformly applying additional p-type material to the substrate which passes into the substrate in the p-well region but not in regions covered with field oxide and silicon nitride; and I. fabricating complementary metal oxide semiconductor transistors in said first and second spaced apart areas.

12. The method of claim 11 further comprising the steps of:

A. removing the field oxide after uniform application of the p-type material to the substrate followed by:

B. uniformly applying n-type material to the surface of the substrate.

13. The method of claim 12 wherein said p-well is formed to a depth of at least 2 $\mu$m.

14. The method of claim 13 wherein said p-well is formed to a depth of approximately 2 $\mu$m to 20 $\mu$m.

15. The method of claim 11 wherein said substrate has a resistivity in the range of 0.9–1.2 ohm-cm.

* * * * *

UNITED STATES PATENT AND TRADEMARK OFFICE
CERTIFICATE OF CORRECTION

PATENT NO. : 4,713,329

DATED : December 15, 1987

INVENTOR(S) : Robert Fang et al.

It is certified that error appears in the above-identified patent and that said Letters Patent is hereby corrected as shown below:

On the Title Page, Item [73] Assignee add:

--- Silicon Systems, Inc. Tustin, CA. ---

Signed and Sealed this

Ninth Day of August, 1988

Attest:

DONALD J. QUIGG

Attesting Officer

Commissioner of Patents and Trademarks